United States Patent
Lin et al.

(10) Patent No.: US 9,437,547 B2
(45) Date of Patent: Sep. 6, 2016

(54) THROUGH SILICON VIAS

(71) Applicant: GLOBALFOUNDRIES Singapore Pte. Ltd., Singapore (SG)

(72) Inventors: Benfu Lin, Singapore (SG); Hong Yu, Rexford, NY (US); Lup San Leong, Singapore (SG); Alex See, Singapore (SG); Wei Lu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/063,526

(22) Filed: Mar. 8, 2016

(65) Prior Publication Data

US 2016/0190066 A1    Jun. 30, 2016

Related U.S. Application Data

(62) Division of application No. 13/831,898, filed on Mar. 15, 2013, now Pat. No. 9,287,197.

(51) Int. Cl.
| | |
|---|---|
| *H01L 23/48* | (2006.01) |
| *H01L 23/52* | (2006.01) |
| *H01L 29/40* | (2006.01) |
| *H01L 23/535* | (2006.01) |
| *H01L 23/528* | (2006.01) |
| *H01L 23/532* | (2006.01) |

(52) U.S. Cl.
CPC .......... *H01L 23/535* (2013.01); *H01L 23/528* (2013.01); *H01L 23/53295* (2013.01)

(58) Field of Classification Search
USPC .................................................. 257/737, 774
See application file for complete search history.

(56) References Cited

U.S. PATENT DOCUMENTS

| | | | | |
|---|---|---|---|---|
| 2010/0015805 A1* | 1/2010 | Mayer | ....................... | C23F 1/02 438/692 |
| 2012/0261827 A1* | 10/2012 | Yu | ..................... | H01L 21/76898 257/774 |

* cited by examiner

*Primary Examiner* — Marc Armand
*Assistant Examiner* — Wilner Jean Baptiste
(74) *Attorney, Agent, or Firm* — Horizon IP Pte. Ltd.

(57) ABSTRACT

A device and methods for forming a device are disclosed. A substrate is provided and a TSV is formed in the substrate through a top surface of the substrate. The TSV and top surface of the substrate is lined with an insulation stack having a first insulation layer, a polish stop layer and a second insulation layer. A conductive layer is formed on the substrate. The TSV is filled with conductive material of the conductive layer. The substrate is planarized to remove excess conductive material of the conductive layer. The planarizing stops on the polish stop layer to form a planar top surface.

20 Claims, 9 Drawing Sheets

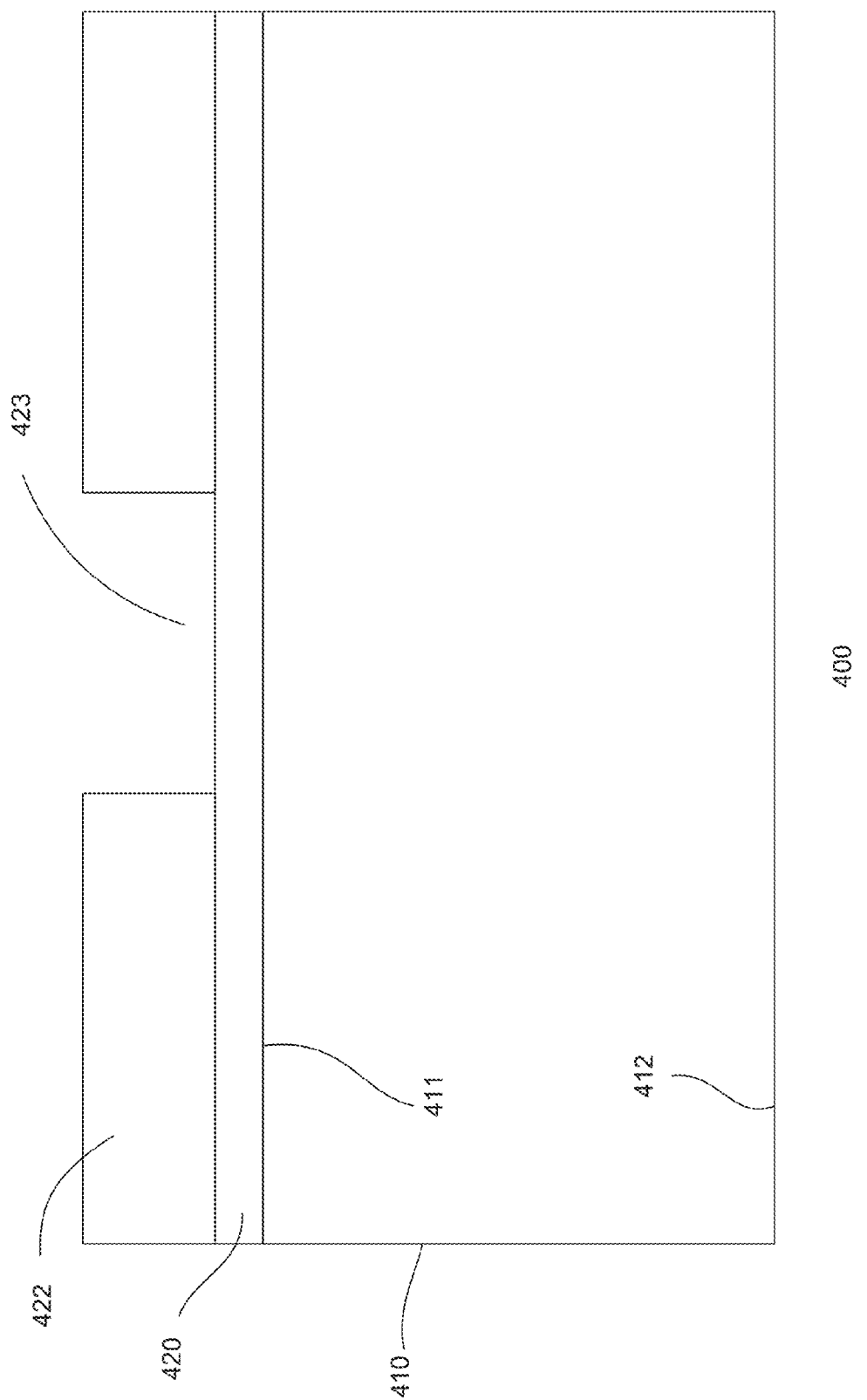

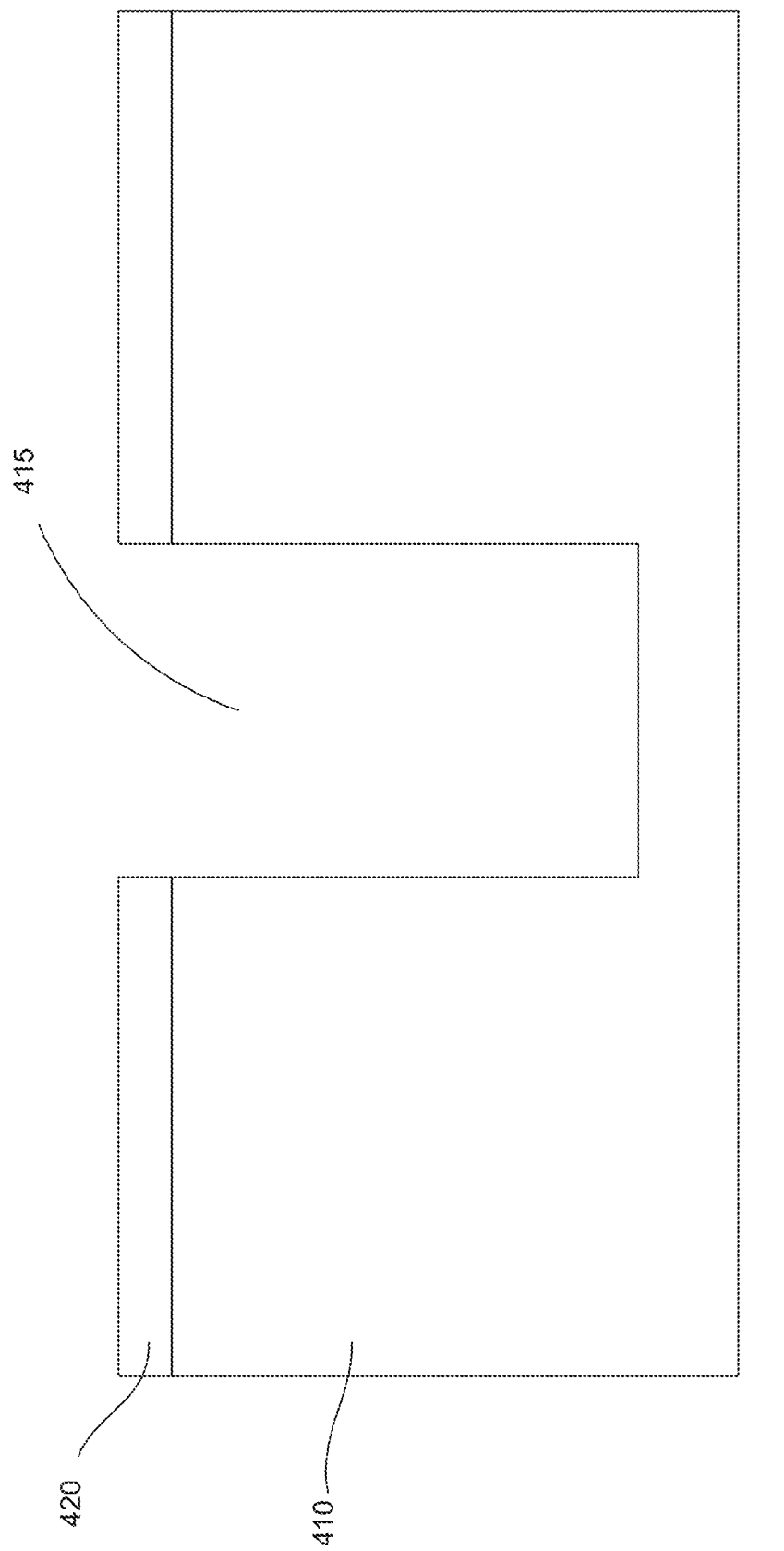

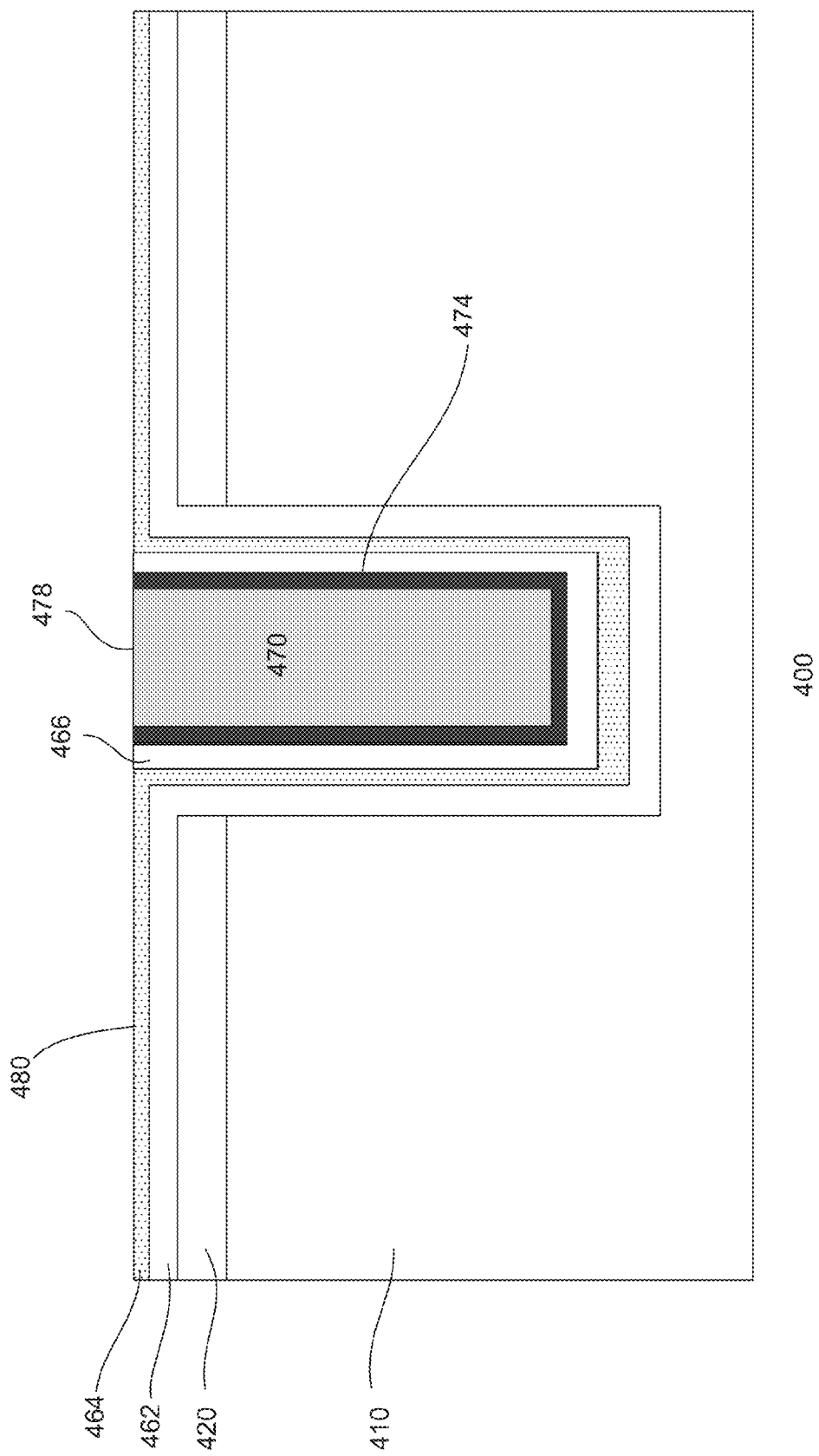

THROUGH SILICON VIAS

CROSS-REFERENCE TO RELATED APPLICATION

This application is a divisional application of co-pending U.S. patent application Ser. No. 13/831,898, filed on Mar. 15, 2013, which is herein incorporated by reference in its entirety.

BACKGROUND

Three dimensional (3D) integrated circuits (ICs) have been employed to increase functionality in a small footprint. For example, a 3D IC is formed by stacking dies and interconnecting them vertically so that they behave as a single device. The stack dies are interconnected by using through silicon via (TSV) technology. TSV technology includes forming TSV contacts, such as copper contacts, which extend though the surfaces of the wafers or dies. The use of TSV contacts can shorten electrical paths, leading to faster operation.

However, there have been problems encountered in conventional TSV processing. For example, to increase performance and reduce cost, larger and thinner wafers are used in semiconductor processing. Thinner and larger wafers are prone to warping. This may lead to problems during processing, such as chemical mechanical polishing (CMP). For example, wafer warpage makes it difficult to control layer uniformity during CMP. Other issues of conventional TSV processing include outgassing during copper barrier formation.

From the foregoing discussion, there is a desire to improve TSV technology to facilitate 3D ICs.

SUMMARY

Embodiments generally relate to semiconductor devices. In one embodiment, a method for forming a device is disclosed. The method includes providing a substrate with top and bottom surfaces. A TSV is formed in the substrate through the top surface. The method includes lining the TSV and the top surface of the substrate with an insulation stack having a first insulation layer, a polish stop layer and a second insulation layer. A conductive layer is formed on the substrate. The conductive layer fills the TSV. The substrate is planarized to remove excess conductive material of the conductive layer. The planarizing stops on the polish stop layer, and a planar top surface for the device is formed.

In another embodiment, a method of forming a device is presented. The method includes providing a substrate with top and bottom surfaces. The substrate includes a TSV formed through the top surface. The method further includes lining the TSV and the top surface of the substrate with an insulation stack having a first insulation layer, a stop layer and a second insulation layer. A conductive layer is formed on the substrate. The conductive layer fills the TSV. Excess conductive material of the conductive layer is removed selective to the stop layer.

In yet another embodiment, a device is provided. The device comprises a TSV in a substrate having top and bottom surfaces. The TSV extends through the top and bottom surfaces of the substrate. The device includes an insulation stack having a first insulation layer, a stop layer and a second insulation layer. The insulation stack lines the sidewalls of the TSV. A top surface of the substrate includes the stop layer over the first insulation layer. A conductive plug is disposed in the TSV. A top surface of the conductive plug is coplanar with a top surface of the stop layer and a bottom surface of the conductive plug is coplanar with the bottom surface of the substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following:

FIGS. 3a-g show a process of forming an embodiment of a device.

DETAILED DESCRIPTION

The present disclosure relates to semiconductor devices and methods for fabricating such devices. More particularly, the present disclosure relates to TSVs which improves surface planarity.

Figure 1:
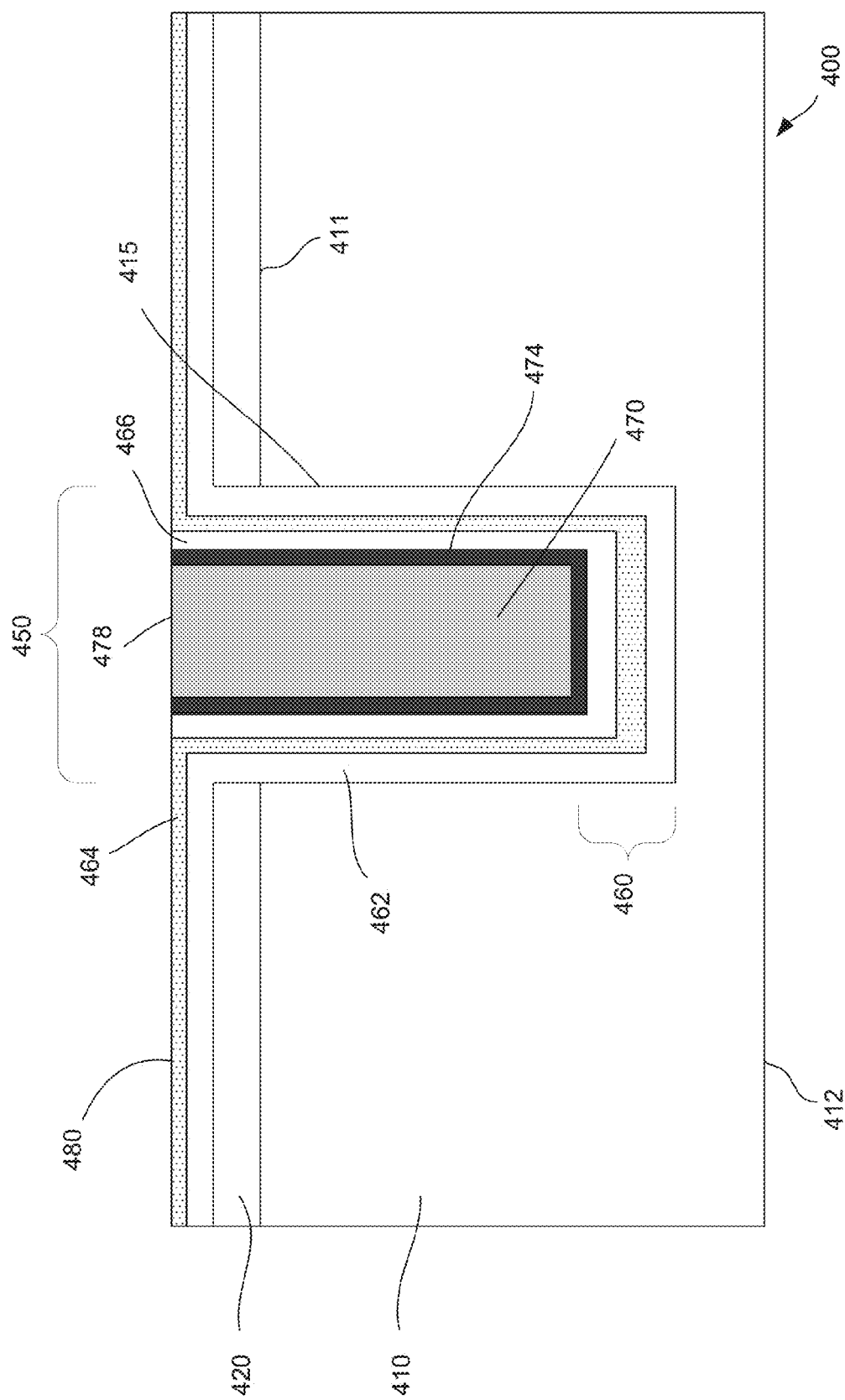
FIG. 1 illustrates an embodiment of a device prior to substrate thinning.
Figure 2:
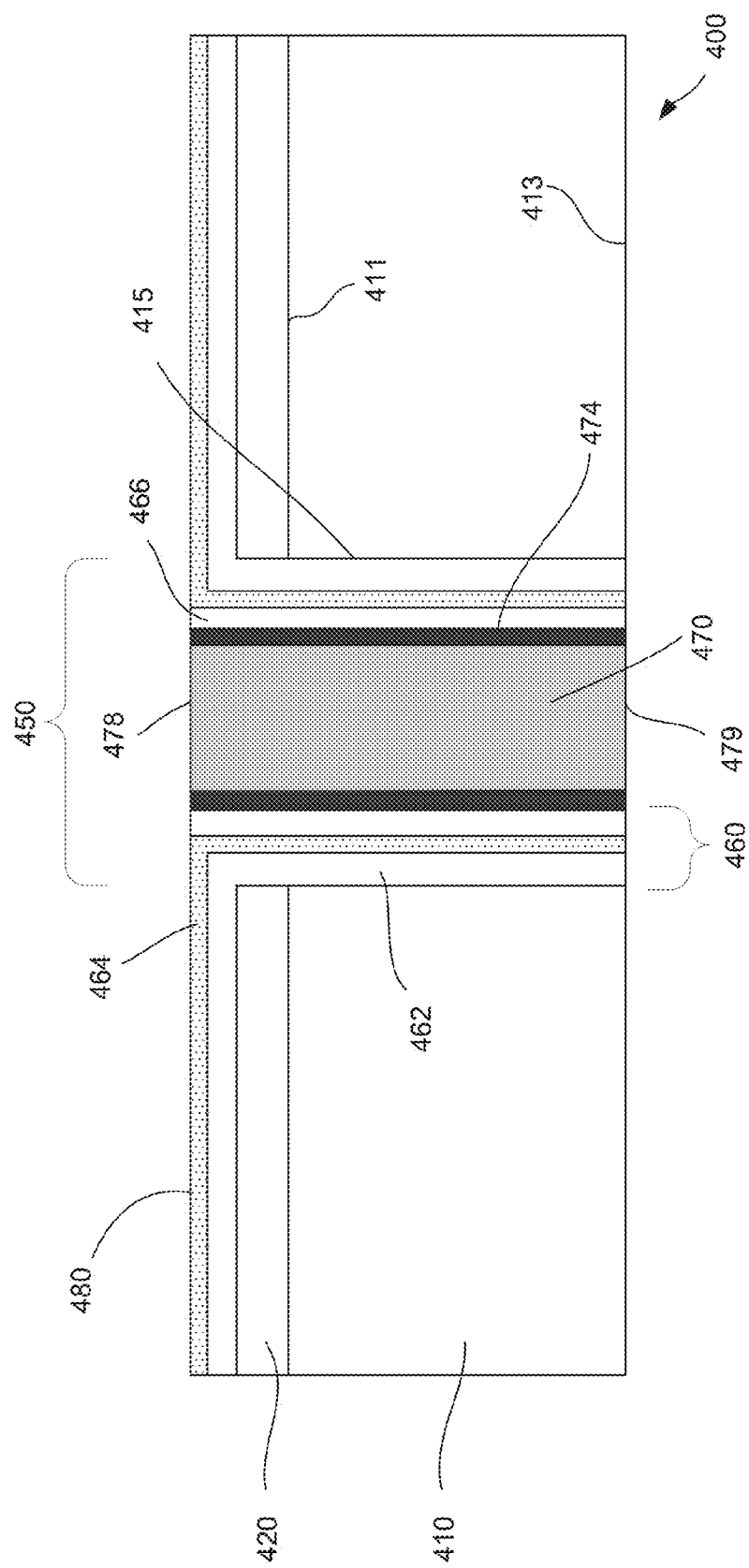
FIG. 2 shows an embodiment of a device after substrate thinning.

FIGS. 1-2 show cross-sectional views of an embodiment of a device 400 at different stages of processing. The device, for example, may be a semiconductor device, such as a semiconductor die of an IC. The IC may be any type of IC. For example, the IC may be memory devices such as a dynamic random access memory (DRAM), a static random access memory (SRAM) and various types of non-volatile memories including programmable read only memories (PROM) and flash memories, logic devices, communication devices, optoelectronic devices, digital signal processors (DSPs), microcontrollers, system-on-chips (SOCs) as well as other types of devices or a combination thereof. Other types of ICs or devices may also be useful. The ICs can be incorporated into various products, such as phones, computers, personal digital assistants or other types of suitable products.

Referring to FIG. 1, the device includes a substrate 410 having top and bottom surfaces 411 and 412. The substrate, for example, may be a semiconductor substrate, such as a silicon substrate. Other types of substrates, for example, SiGe, SiGeC or SiC, are also useful. In other embodiments, the substrate may be a crystalline-on-insulator (COI), such as a silicon-on-insulator (SOI) substrate. Other types of COI substrates may also be useful. The substrate, for example, may be a wafer which includes a plurality of devices. The wafer may be diced to singulate the devices. The initial thickness of the substrate, for example, may be about 750 nm. Other thicknesses may also be useful. The wafer is subsequently thinned to its final thickness, for example, after processing.

A device layer 420 may be disposed on the substrate. The device layer, for example, is disposed on a first surface of the substrate. The first surface, for example, may be the top substrate surface. The top substrate surface may be a bare substrate surface. In other embodiments, the top substrate surface may be a processed substrate surface. The substrate may be at any stage of processing. For example, the substrate may be after pre-metal dielectric (PMD) formation, such as prior to forming a first metal layer or after formation of a final passivation layer, such as after formation of a final metal layer.

The device layer may be a dielectric layer. The device layer, for example, may be an interlevel dielectric (ILD) layer. An ILD layer may include a metal level with metal lines above a via level with contacts. The device layer may be any ILD layer of the device. For example, the device layer may be a first, an intermediate or a top ILD layer of the device. In one embodiment, the device layer may be a PMD layer. For example, the PMD layer is prior to forming the first metal layer. Various materials may be used to form the ILD layer, for example, BPSG, PSG, HDP oxide, HARP, TEOS or a combination thereof. Other types of device layers may also be useful. For example, the device layer may be a hard mask. The hard mask, for example, may be a dielectric material, such as silicon nitride or oxide. The thickness of the device layer, for example, may be about 1 um. Other thicknesses may also be useful. The thickness, for example, may depend on the type of device layer. In other embodiments, the device layer may be a top layer of the device. Other configurations of the device layer may also be useful.

In one embodiment, the device layer is a patterned device layer with an opening corresponding to a TSV 415 in the substrate. The TSV does not extend to the bottom surface of the substrate. The cross-sectional dimensions and depth of the TSV should be sufficient to accommodate a TSV contact 450 disposed in the TSV. The TSV contact, in one embodiment, includes a TSV plug 470, an insulation or isolation liner 460 and a barrier liner 474. The TSV contact may have a circular or square cross-sectional shape. Other cross-sectional shapes may also be useful. Depending on the shape, the cross-sectional dimension may have an effective diameter of about 5 um. As for the depth, it should be sufficient to form a TSV contact plug with the desired final substrate thickness. Typically, the final substrate thickness is about 780 nm. Other thicknesses may also be useful. The TSV may have an aspect ratio of, for example, about 10:1. Other aspect ratios may also be useful.

In one embodiment, the TSV plug is a conductive TSV plug. For example, the TSV plug may be a copper or copper alloy TSV plug. Other types of conductive materials may also be used for the TSV plug. For example, the TSV plug may be formed from tungsten, aluminium, and their alloys or a combination thereof.

The isolation liner serves to electrically isolate the TSV plug from the substrate. The isolation liner is an isolation liner stack having a plurality of liner layers. The various liner layers of the isolation stack, in one embodiment, are dielectric layers. In one embodiment, the isolation liner includes at least three layers. For example, the isolation liner includes first and second isolation liner layers 462 and 466 sandwiching a polish stop layer 464. The polish stop layer, for example, has high selectivity between the first and second isolation liner layers. In one embodiment, the first and second isolation liner layers are silicon oxide while the polish stop layer may be, for example, silicon nitride (SiN), silicon carbide (SiC) or Nblok. The thickness of a layer of the isolation stack may be, for example, about 300 nm. Other thicknesses for the layers may also be useful. Providing other configurations of isolation stacks may also be useful. For example, the isolation liner layers can be different types of dielectric materials or have different thicknesses. The various layers of the stack should be designed to reduce coefficient of thermal expansion (CTE) issues. The barrier liner is disposed between the isolation liner and TSV plug. The barrier liner serves to prevent out-diffusion of the conductive material of the TSV plug to the isolation liner and substrate. For example, the barrier liner may be a copper barrier to prevent diffusion of copper from the TSV plug. The barrier liner may also improve adhesion of the TSV plug to the isolation liner. The thickness of the barrier layer may be about 100 nm. Providing barrier layer with other thicknesses is also useful. Refractory metals, refractory metal nitrides, refractory metal silicon nitrides and combinations thereof are typically used for the barrier layer. For example, the barrier layer may include a refractory material, such as TiN, TaN, Ti, Ta, TiSN, TaSN, Cr, Co, Ni, Pt, CoP, or a combination thereof. Other types of barrier materials that can inhibit diffusion of the conductive material into the dielectric layers may also be useful. In one embodiment, the barrier liner comprises a Ti layer and a TiN layer. In another embodiment, the barrier liner is a Ta layer. In yet another embodiment, the barrier liner is a Ta/TaN liner stack.

A top surface 478 of the TSV plug is exposed. As shown, the TSV plug, polish stop layer, second insulation liner layer and barrier liner form a planar top surface 480. The polish stop layer, for example, serves as a polish stop for a polish process, such as chemical mechanical polishing (CMP). In some instances, there may be slight erosion of plug and second insulation liner materials below the surface of the polish stop layer. Providing a multi-layered insulation liner with a polish stop improves surface planarity of the substrate.

In the case where additional metal layers are provided on the substrate, electrical connection to the TSV plug may be provided by contacts in the additional via and metal levels until the top of the TSV plug is exposed at the top of the device. For example, in the case where the device layer is not the top layer of the device, electrical connection to the TSV plug may be provided by contacts in the additional via and metal levels until the top of the TSV plug is exposed at the top of the device. As for a bottom surface 479 of the TSV plug, it is exposed by thinning the substrate, as shown in FIG. 2. For example, the bottom surface of the substrate is removed by back grinding to expose the bottom surface of the TSV plug.

As described, the device includes one TSV contact. It is understood that an actual device may include numerous TSV contacts. The TSV contacts are disposed in the TSV region of the device. For example, the TSV region is at the periphery of a die. An interposer (not shown), such as a redistribution layer (RDL), may be provided to interconnect the TSV plugs to, for example, contact pads of the device.

The use of the isolation stack for TSV plugs, as described, increases planarity and thickness uniformity across the wafer. This results in uniform thickness of the TSVs, which results in electrical uniformity within the device and across the wafer. This improves reliability and performance of the device. Additionally, the isolation stack improves outgassing issue. For example, the isolation stack reduces the time required for outgassing a chamber, for example, for forming the TSV barrier layer. This improves processing throughput, and reduces cost.

Figure 3C:
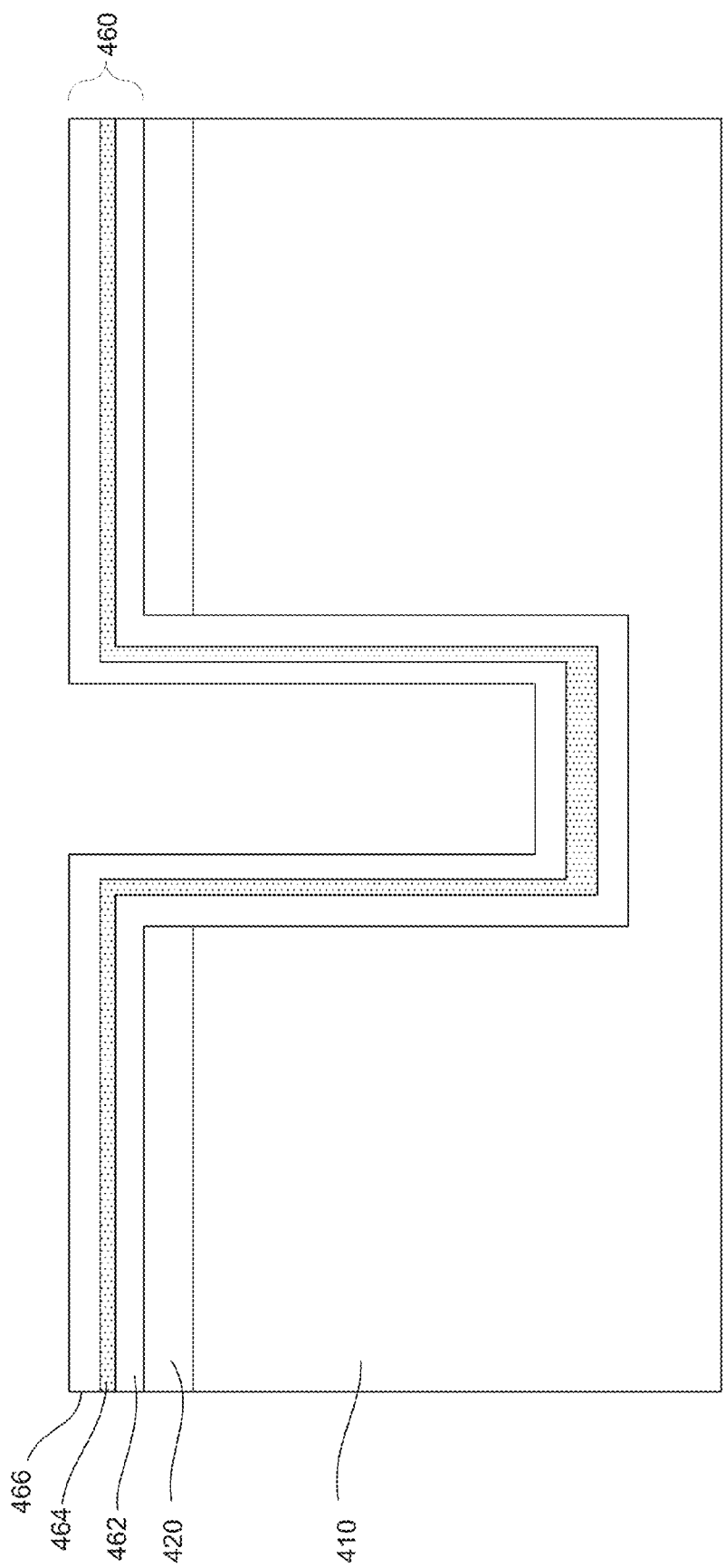

FIGS. 3*a-g* show an embodiment of a method for forming a device 400. The device may be similar to that described in FIGS. 1-2. Similar elements may not be described or described in detail. Referring to FIG. 3*a*, the device includes a substrate 410 having top and bottom surfaces 411 and 412.

The substrate, for example, may be a semiconductor substrate, such as a silicon substrate.

A device layer 420 is deposited on the substrate. The device layer, for example, is deposited on the first surface of the substrate. As previously discussed, the substrate may be at any stage of processing. In one embodiment, the device layer is a dielectric layer. Other types of device layers may also be useful. The dielectric layer, for example, is an ILD layer. The ILD layer may be any ILD layer of the device. The dielectric layer, for example, may be silicon oxide. Other types of dielectric materials may also be useful. In some cases, the device layer may be a hard mask layer, such as silicon oxide or silicon nitride. The device layer, for example, may be about 1 um thick. Other thicknesses or types of hard masks may also be useful. The device layer may be deposited by, for example, chemical vapor deposition (CVD). Other techniques for forming the device layer may also be useful.

The device layer is patterned. The device layer may be patterned by conventional techniques. For example, a soft mask 422, such as photoresist or resist, is exposed with an exposure source through a reticle having the desired pattern. To improve lithographic resolution, an anti-reflective coating (ARC) layer may be provided below the resist layer. After development, the pattern of the reticle is transferred to the resist layer. For example, the resist includes an opening 423. The mask opening corresponds to a TSV in the substrate. The mask opening, for example, is located in a TSV region of the substrate.

In FIG. 3b, the substrate is patterned to form a TSV 415. For example, the substrate, including the device layer, is patterned. The substrate is patterned using an anisotropic etch, such as a deep RIE (DRIE). Other techniques may also be used to form the TSV. The substrate may be patterned using the soft mask. In other embodiments, such as in the case where the device layer is a hard mask, the hard mask is patterned using the soft mask. The soft mask may then be removed and the substrate is patterned using the hard mask to form the TSV. Other configurations for forming the TSV may also be useful.

As shown in FIG. 3c, the process continues to form an insulation liner 460. In one embodiment, the isolation liner is an isolation liner stack having a plurality of liner layers. The various liner layers of the isolation stack, for example, are dielectric layers. In one embodiment, the isolation liner includes at least three layers. For example, the isolation liner includes a first isolation liner layer 462, a polish stop layer 464 and a second isolation liner layer 466. The polish stop layer, for example, has CMP selectivity between the isolation liner layers. In one embodiment, the isolation liner layers are silicon oxide layers while the polish stop layer is a silicon nitride layer. The thickness of a liner layer of the isolation stack may be about 300 nm. Providing other configurations of isolation liner stacks may also be useful. For example, the isolation liner layers may be different types of dielectric materials or have different thicknesses.

Figure 3D:
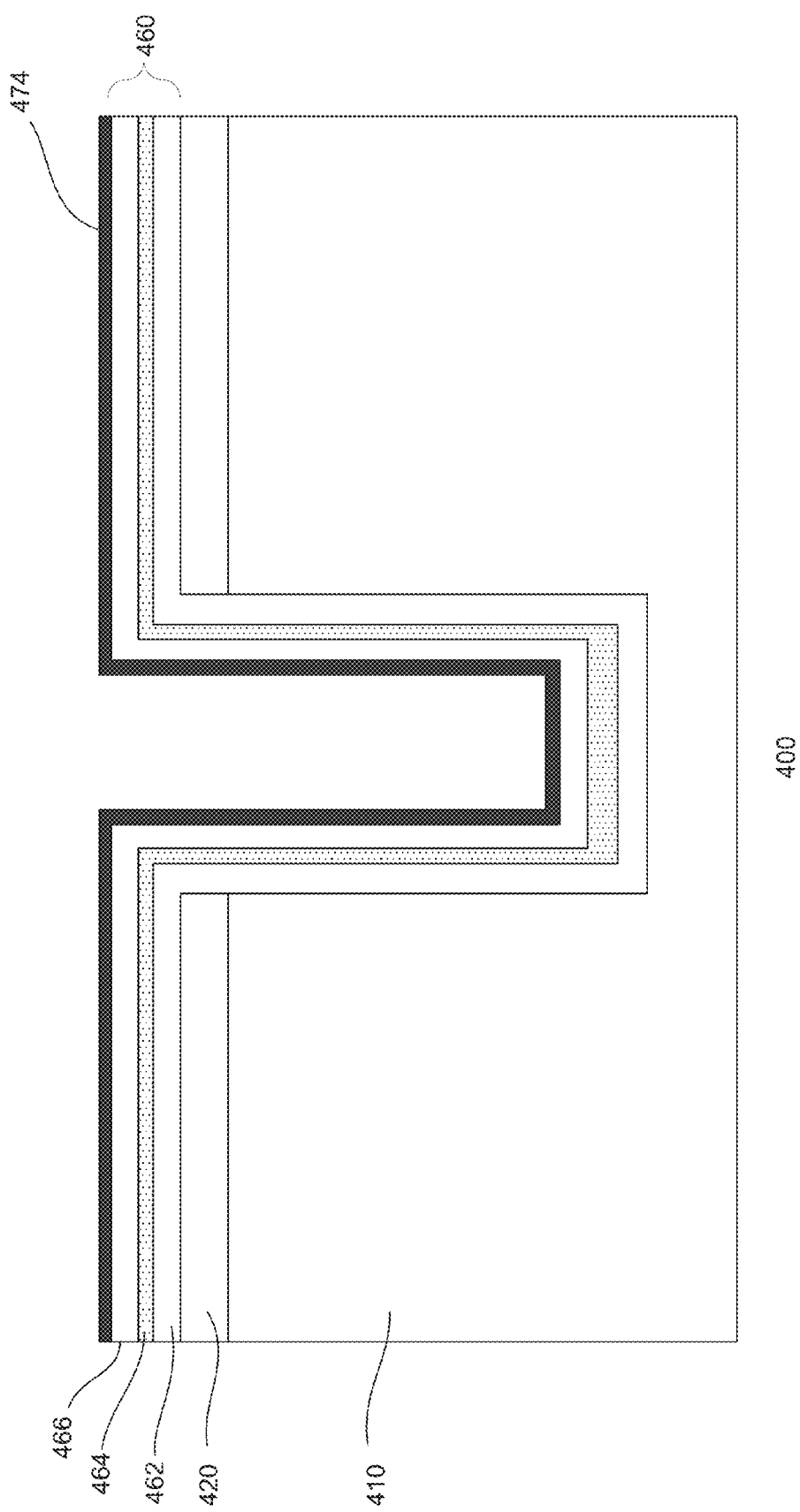

In one embodiment, the layers of the isolation liner stack are sequentially formed on the substrate. For example, the first isolation liner layer is formed on the substrate, followed by the polish stop layer and finally the second isolation liner layer. The liner layers are conformal layers, lining the substrate. The conformal layers may be formed by, for example, CVD. Other techniques for forming the liner layers may also be useful. As shown in FIG. 3d, a barrier liner layer 474 is formed on the substrate. The barrier liner lines the surface of the isolation liner over the substrate surface and in the TSV. The barrier liner serves to prevent out-diffusion of the conductive material of a subsequently formed TSV plug to the isolation liner and substrate. For example, the barrier layer may be a copper barrier to prevent diffusion of copper from the TSV plug. The barrier liner may also serve other purposes. The thickness of the barrier liner may be about 100 nm. Providing a barrier liner with other thicknesses is also useful. In one embodiment, the barrier liner may be a Ti/TiN liner. Other types of barrier liners, such as Ti, TiN, Ta, TaN, TiSN, TaSN, Cr, Co, Ni, Pt, CoP or a combination thereof may also be useful. The barrier liner may be formed by, for example, sputtering. Other techniques for forming the barrier liner may also be useful.

Depositing the barrier liner is performed in, for example, a vacuum chamber. The isolation stack reduces outgassing time to create the vacuum. This results in improved throughput.

Figure 3E:
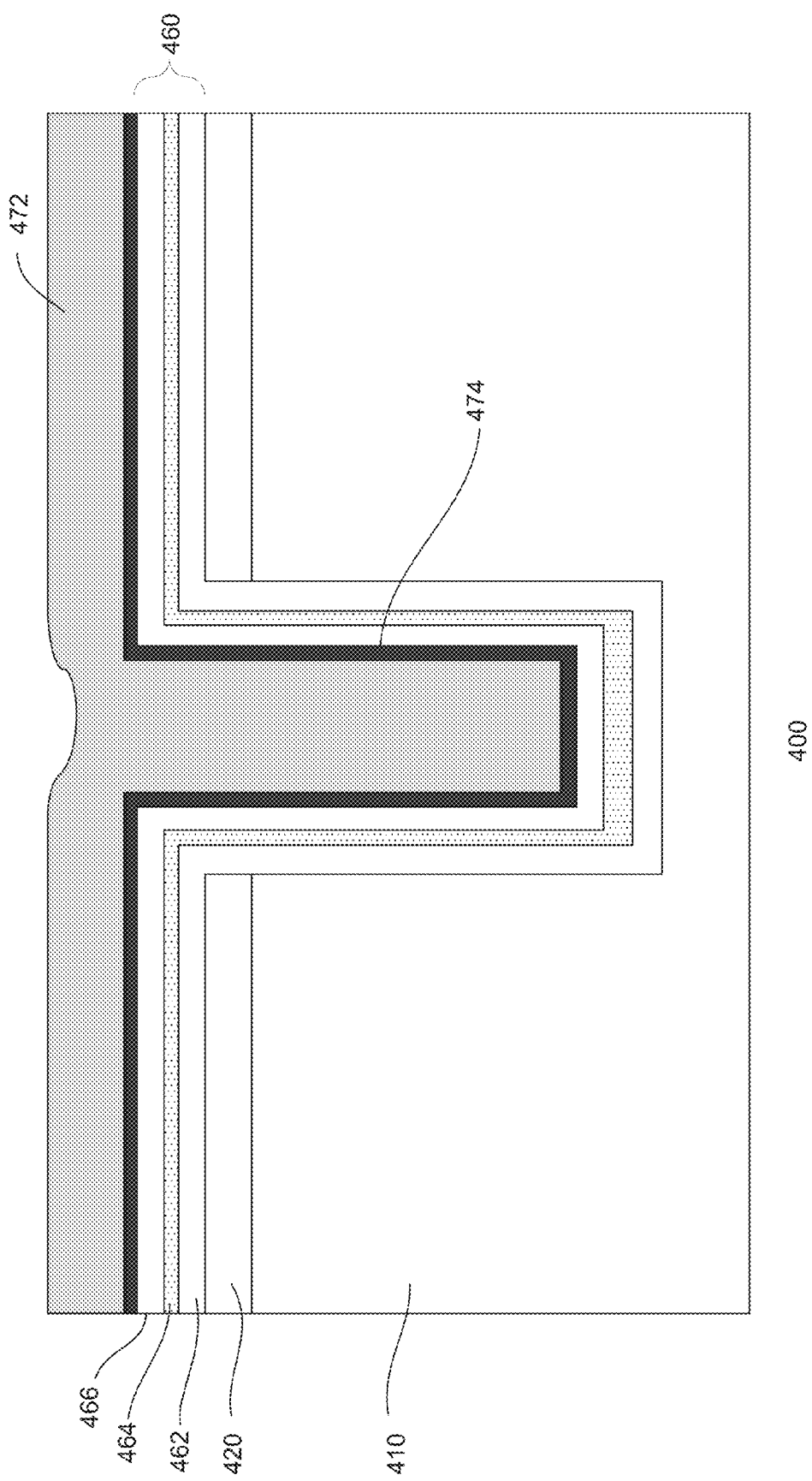

Referring to FIG. 3e, the process continues to form the TSV plug. For example, a conductive layer 472 is formed on the substrate covering the barrier liner and filling the TSV. As shown, the conductive layer includes excess conductive material to ensure filling of the TSV. The conductive layer, in one embodiment, is a copper or copper alloy conductive layer. Other types of conductive materials, including metals and alloys may also be useful. For example, the conductive layer may be formed from aluminum, tungsten, and their alloys or a combination thereof. The conductive layer may be formed by plating. For example, the conductive layer may be formed by electro or electro-less plating. A seed layer may be provided over the barrier liner to facilitate forming the conductive layer. Other techniques for forming the conductive layer, such as CVD, physical vapor deposition (PVD) or sputtering may also be useful.

In FIG. 3f, a planarizing process is performed on the substrate. The planarizing process removes excess conductive material to form a TSV plug 470. In one embodiment, the planarizing process includes polishing, such as CMP. Other types of planarizing processes, such as electro-CMP (eCMP), may also be useful. The planarizing process may also be performed with etch-back techniques. In one embodiment, the planarizing process stops on the polish stop layer. For example, excess material above the top surface of the polish stop layer is removed, leaving a planar or substantially planar top surface 480 between the polish stop layer, second isolation liner layer, barrier liner layer and TSV plug. Providing the polish stop layer improves control of the planarizing process.

Figure 3G:
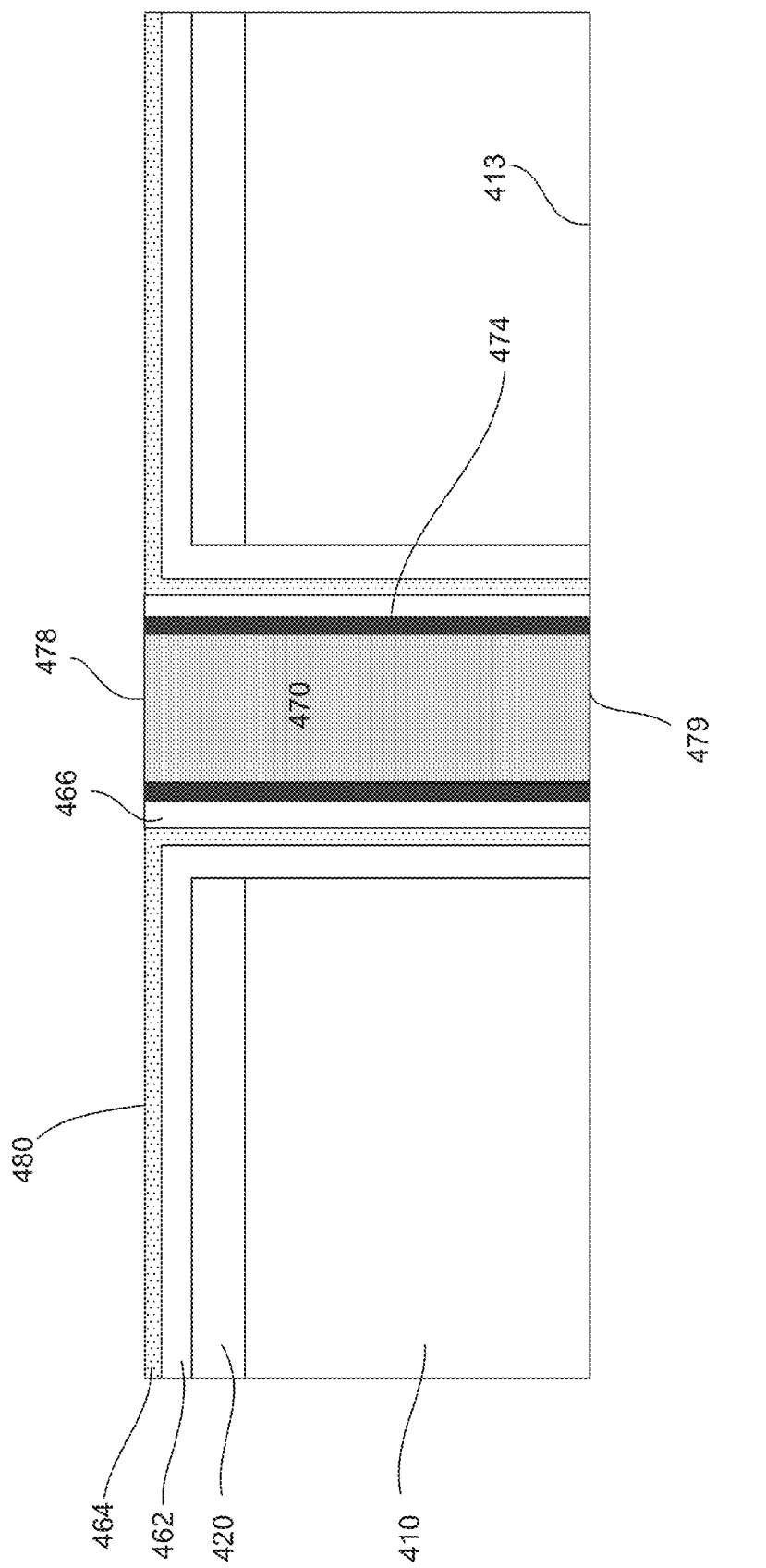

As shown in FIG. 3g, the bottom surface of the substrate is grinded until a bottom surface 479 of the TSV plug is exposed. The back grinding forms a planar surface between the grinded bottom substrate surface 413 and the bottom surface of the TSV plug. Additional steps may be performed before back grinding the substrate. The process continues to complete the device. This for example, includes forming connections to the components of the device and the TSV contacts, dicing and packaging. Other processes may also be included, depending on the stage of processing that the TSV contacts are formed or type of device. Additionally, multiple devices with TSV contacts may be stacked. Redistribution layers may be employed to provide connections between devices.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate with top and bottom surfaces;
   a through silicon via (TSV) in the substrate, the TSV extends through top and bottom surfaces of the substrate;
   an insulation stack disposed in the TSV, the insulation stack lines the sidewalls of the TSV and comprises a first insulation layer, a polish stop layer and a second insulation layer, wherein the polish stop layer lines the first insulation layer and the second insulation layer lines the polish stop layer in the TSV, the first insulation layer and the polish stop layer further extends over the top surface of the substrate and continuously line the top surface, wherein the polish stop layer is disposed over the first insulation layer; and
   a conductive plug disposed in the TSV and fills the TSV having the insulation stack lining the sidewall, wherein a top surface of the conductive plug in the TSV is coplanar with a top surface of the polish stop layer over the top surface of the substrate, the polish stop layer serves as a polish stop for a planarizing process.

2. The device of claim 1 wherein a bottom surface of the conductive plug is coplanar with the bottom surface of the substrate.

3. The device of claim 2 wherein the first and second insulation layers comprise silicon oxide and the polish stop layer comprises silicon nitride.

4. The device of claim 1 wherein the substrate includes a device layer disposed on the top surface of the substrate, the device layer is patterned with an opening corresponding to the TSV, wherein the first insulation layer and the polish stop layer line the device layer over the top surface of the substrate.

5. The device of claim 4 wherein the device layer comprises an interlevel dielectric (ILD) layer.

6. The device of claim 4 wherein the device layer comprises a top layer of the device.

7. The device of claim 6 comprising an interposer layer for connecting the TSV to a contact pad of the device.

8. The device of claim 4 wherein the first and second insulation layers comprise silicon oxide and the polish stop layer comprises silicon nitride.

9. The device of claim 1 further comprising a TSV barrier layer disposed in between the insulation stack and the conductive plug in the TSV.

10. The device of claim 1 wherein the first and second insulation layers comprise silicon oxide and the polish stop layer comprises silicon nitride.

11. A device comprising:
    a substrate with top and bottom surfaces;
    a through silicon via (TSV) in the substrate, the TSV extends from the top surface into the substrate;
    an insulation stack disposed in the TSV, the insulation stack lines the sidewalls of the TSV and comprises a first oxide layer, a nitride layer and a second oxide layer, wherein the nitride layer lines the first oxide layer and the second oxide layer lines the nitride layer in the TSV, the first oxide layer and the nitride layer further extends over the top surface of the substrate and continuously line the top surface, wherein the nitride layer is disposed over the first oxide layer; and
    a conductive plug disposed in the TSV and fills the TSV having the insulation stack which lines the sidewall of the TSV, wherein a top surface of the conductive plug in the TSV is coplanar with a top surface of the nitride layer over the top surface of the substrate.

12. The device of claim 11 wherein a bottom surface of the conductive plug is coplanar with the bottom surface of the substrate.

13. The device of claim 11 wherein the conductive plug extends partially into the substrate.

14. The device of claim 13 wherein the first and second oxide layers comprises silicon oxide and the nitride layer comprises silicon nitride.

15. The device of claim 11 further comprising a TSV barrier layer disposed in between the insulation stack and the conductive plug in the TSV.

16. The device of claim 11 wherein the substrate includes a device layer disposed on the top surface of the substrate, the device layer is patterned with an opening corresponding to the TSV, wherein the first oxide layer and the nitride layer line the device layer over the top surface of the substrate.

17. The device of claim 16 wherein the device layer comprises an interlevel dielectric (ILD) layer.

18. The device of claim 17 wherein the first and second oxide layers comprises silicon oxide and the nitride layer comprises silicon nitride.

19. The device of claim 16 comprising an interposer layer for connecting the TSV to a contact pad of the device.

20. The device of claim 11 wherein the first and second oxide layers comprise silicon oxide and the nitride layer comprises silicon nitride.

* * * * *